United States Patent [19]

Tsunoda et al.

[11] 4,365,049
[45] Dec. 21, 1982

[54] FLUOROALKYL ACRYLATE COPOLYMER AND COMPOSITION CONTAINING THE SAME

[75] Inventors: Takahiro Tsunoda; Tsuguo Yamaoka, both of Funabashi; Sinji Tamaru, Suita, all of Japan

[73] Assignee: Daikin Kogyo Co., Ltd., Osaka, Japan

[21] Appl. No.: 246,156

[22] Filed: Mar. 23, 1981

[30] Foreign Application Priority Data

Mar. 31, 1980 [JP]   Japan ................................ 55-42704

[51] Int. Cl.$^3$ .............................................. C08F 20/22
[52] U.S. Cl. .................................. 526/245; 204/159.14
[58] Field of Search .......................................... 526/245

[56] References Cited

U.S. PATENT DOCUMENTS 4,125,672  11/1978  Kakuchi et al. ..................... 428/421

OTHER PUBLICATIONS

Kenichi Koseki et al., Japanese Publication–Kobunshi Ronbunshu, vol. 35, No. 5, pp. 331-337 (May 1978).

Primary Examiner—Harry Wong, Jr.
Attorney, Agent, or Firm—Armstrong, Nikaido, Marmelstein & Kubovcik

[57] ABSTRACT

A fluoroalkyl acrylate copolymer comprising recurring units of the general formula (I):

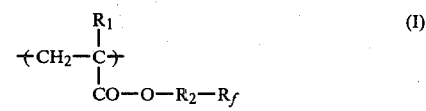

wherein $R_1$ is hydrogen atom or methyl group, $R_2$ is a bivalent hydrocarbon group and $R_f$ is a $C_2$ to $C_6$ straight or branched perfluoroalkyl group or a $C_2$ to $C_6$ straight or branched fluoroalkyl group having hydrogen atoms of not less than one and of not more than half of the number of the carbon atoms, and recurring units of the general formula (II):

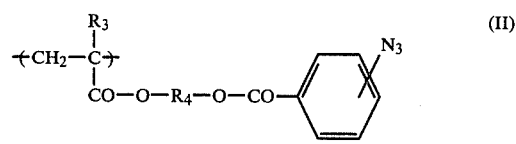

wherein $R_3$ is hydrogen atom or methyl group and $R_4$ is a bivalent hydrocarbon group or a mono-substituted bivalent hydrocarbon group with hydroxyl group or a halogen except fluorine. The copolymer is curable with light and energy rays, and is suitable as a material sensitive thereto for use in resist, dry lithographic printing plate and paint.

3 Claims, 3 Drawing Figures

FLUOROALKYL ACRYLATE COPOLYMER AND COMPOSITION CONTAINING THE SAME

BACKGROUND OF THE INVENTION

The present invention relates to a novel fluoroalkyl acrylate copolymer and its use, and more particularly to a fluoroalkyl acrylate copolymer curable with a light or energy ray and a sensitive composition containing the copolymer.

Hitherto, it is known that a hompolymer having recurring units of the general formula (I):

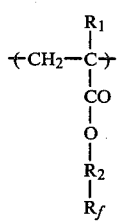

wherein $R_1$ is hydrogen atom or methyl group, $R_2$ is a bivalent hydrocarbon group, and $R_f$ is a $C_2$ to $C_6$ straight or branched perfluoroalkyl group or a $C_2$ to $C_6$ straight or branched fluoroalkyl group having hydrogen atoms of not less than one and of not more than half of the number of the carbon atoms,
forms a film having a low surface energy, thus having a water-repellent property and can be used as water-repellent coatings. Also, the homopolymer has a sensitivity to far ultraviolet rays having a wavelength of not more than about 3,000 angstroms, electron beams and X-rays to undergo degradation, and is useful as a resist of positive type in which the irradiated portion of the film is dissolved by a developer and the unirradiated portion is left undissolved.

However, this homopolymer film has a defect of having poor strength and poor adhesiveness to a substrate, and it is necessary to treat at high temperatures in order to reduce such a defect. Further, this homopolymer has no sensitivity to near ultraviolet rays having a wavelength of about 4,000 to about 3,000 angstroms, and also in the case where the homopolymer resist is irradiated even by far ultraviolet rays, electron beams or X-rays, the remaining unirradiated portion of the resist is poor in adhesiveness and the homopolymer film is not suitable particularly for producing a fine pattern.

It is an object of the present invention to provide a novel copolymer sensitive to a light and energy ray.

A further object of the invention is to provide a polymer curable by radiation of a light or energy ray.

A still further object of the invention is to provide a light and energy ray curable polymer capable of giving a film having good film strength and good adhesiveness and sufficient water and oil repellent properties.

Another object of the invention is to provide a light and energy ray sensitive composition.

These and other objects of the invention will become apparent from the description hereinafter.

SUMMARY OF THE INVENTION

In accordance with the present invention, there is provided a fluoroalkyl acrylate copolymer comprising recurring units of the general formula (I):

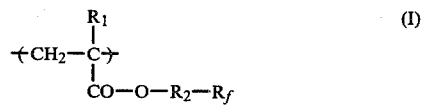

wherein $R_1$ is hydrogen atom or methyl group, $R_2$ is a bivalent hydrocarbon group, and $R_f$ is a $C_2$ to $C_6$ straight or branched perfluoroalkyl group or a $C_2$ to $C_6$ straight or branched fluoroalkyl group having hydrogen atoms of not less than one and of not more than half of the number of the carbon atoms,
and recurring units of the general formula (II):

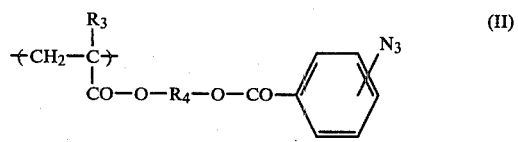

wherein $R_3$ is hydrogen atom or methyl group, and $R_4$ is a bivalent hydrocarbon group or a mono-substituted bivalent hydrocarbon group with hydroxyl group or a halogen except fluorine.

The fluoroalkyl acrylate copolymer of the present invention has a sensitivity to not only far ultraviolet rays, electron beams and X-rays, but also near ultraviolet rays, and can be cured by irradiation of these light and energy rays without heat treatment at high temperatures to provide a film having good film strength and good adhesiveness and sufficient water and oil repellent properties. Therefore, the copolymer is useful as a light and energy ray sensitive material and is suitable for various uses such as a printing plate, a protecting coating, a paint and a resist.

DETAILED DESCRIPTION

Figure 1:
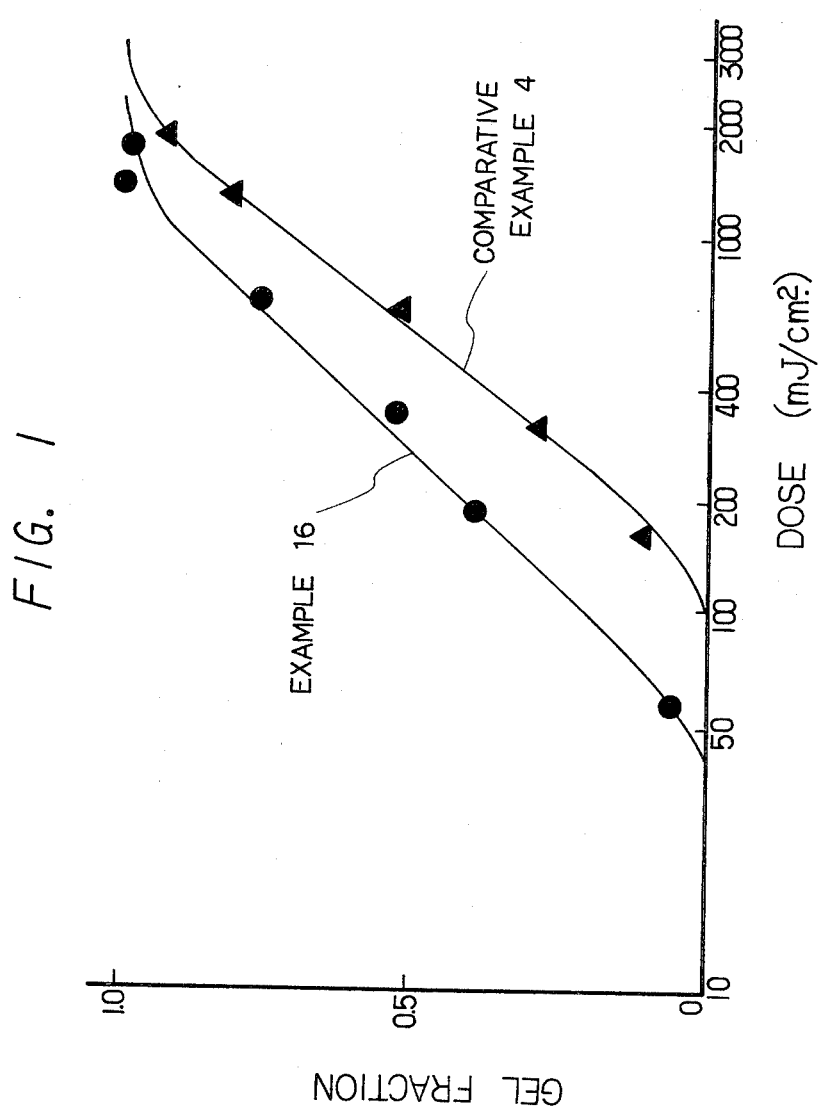
FIG. 1 is a graph showing the relationship between dose and gel fraction in irradiation of X-rays to a fluoroalkyl acrylate copolymer of the present invention and a conventional fluoroalkyl acrylate homopolymer.

The term "fluoroalkyl acrylate copolymer" as used herein means "fluoroalkyl acrylate copolymer" and "fluoroalkyl methacrylate copolymer".

The fluoroalkyl acrylate copolymer of the present invention has sensitivity to not only far ultraviolet rays, X-rays and electron beams, but also near ultraviolet rays, and the relative sensitivity to near ultraviolet rays is about 0.005 to about 0.7 based on a homopolymer of 2-methacryloyloxyethyl p-azidobenzoate which is a known photosensitive polymer. Therefore, the copolymer of the present invention is sufficiently curable by exposure to natural light for a long period of time.

The copolymer of the present invention is curable with near ultraviolet rays, far ultraviolet rays, electron beams and X-rays, and provides a film capable of forming a negative type fine pattern by irradiation of such rays of light and energy rays followed by development.

The critical surface tension of the irradiation cured film is considerably low, i.e. 18 to 25 dynes/cm. (at 20° C.), and accordingly the cured film has good water-repellent and oil-repellent properties.

The copolymer of the present invention has also a good adhesiveness and can be satisfactorily used as a paint material. For instance, a coating of the copolymer of the present invention shows no separation in the following test. In the test, eleven cut lines spaced apart by 1 mm. are formed by a knife through the coating to an aluminum plate in vertical and horizontal directions respectively to form 100 squares, a cellophane adhesive tape is stuck onto the cut coating and peeled off and the separation of the squares of the coating from the plate is then observed.

These properties of the copolymer of the invention are brought about by the $R_f$ group in the recurring units (I) and the azidobenzoyl group in the recurring units (II). The $R_f$ group which is a polyfluoroalkyl group raises, while raising the absorption efficiency to high energy rays such as far ultraviolet rays, electron beams and X-rays, the water-repellent and oil-repellent properties and the solvent resistance in the cured copolymer. On the other hand, the azidobenzoyl group makes the copolymer sensitive to a light such as ultraviolet rays so as to cure the copolymer, thus increasing the adhesiveness and forming a resist of negative type.

The number average molecular weight of the copolymer of the present invention is on the order of about $10^3$ to about $10^6$, and the ratio of the weight average molecular weight to the number average molecular weight is from about 1 to about 5.

The copolymer of the present invention is soluble in organic solvents such as methyl cellosolve, ethyl cellosolve, dioxane, acetone, cyclohexanone, γ-butyrolactone, tetrachloroethane, tetrahydrofuran, dimethyl sulfoxide, dimethyl formamide and methyl cellosolve acetate.

The recurring unit (I) in the copolymer of the present invention is a unit derived from an alkyl acrylate or an alkyl methacrylate, and the alkyl group is a group represented by the formula $-R_2-R_f$. The $R_f$ group is, as defined above, a straight or branched fluoroalkyl group having 2 to 6 carbon atoms. The $R_2$ group is a group linking the $R_f$ group to the acrylic or methacrylic polymer chain and may be any of bivalent hydrocarbon groups capable of linking the $R_f$ group to the acrylic or methacrylic polymer. Preferably, the $R_2$ group is a bivalent hydrocarbon group having 1 to 5 carbon atoms, especially 1 to 3 carbon atoms, but the carbon number is not critical.

The recurring unit (II) in the copolymer of the present invention is a unit derived from an alkyl acrylate or an alkyl methacrylate, and the alkyl group is a group represented by the formula:

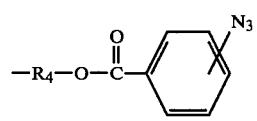

The azido group may be attached to the benzene ring at any of ortho, meta and para positions, and the para position is particularly preferred. The $R_4$ group is a group linking the azidobenzoic acid residue to the acrylic or methacrylic polymer chain, and may be any of bivalent unsubstituted or substituted hydrocarbon groups capable of linking the azidobenzoic acid residue to the acrylic or methacrylic polymer chain. Preferably, the $R_4$ group is a bivalent hydrocarbon group or a mono-substituted bivalent hydrocarbon group with hydroxyl group or a halogen except fluorine, e.g. chlorine or bromine. The carbon number of the above unsubstituted or substituted hydrocarbon group is preferably from 1 to 5, especially 1 to 3, but is not critical.

Examples of the recurring unit (I) are mentioned below.

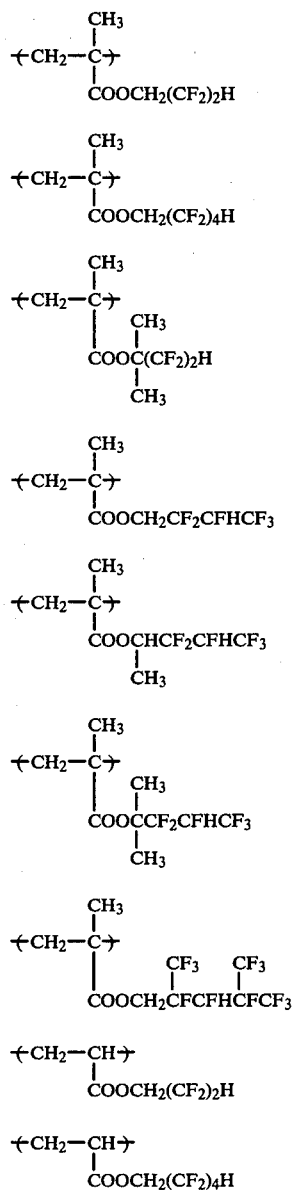

In particular, as a recurring unit (I), there is preferred a recurring unit of the general formula (Ia):

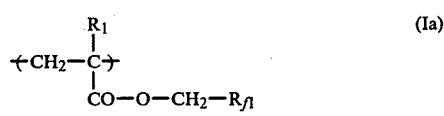

wherein $R_1$ is as defined above and $R_{f1}$ is $-CF_2CFHCF_3$ or $-(CF_2)_4H$, and the recurring unit of the following formula:

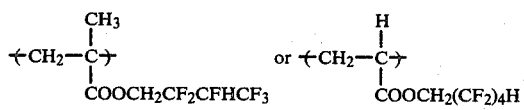

is exemplified as a recurring unit (Ia).

Examples of the recurring unit (II) are mentioned below.

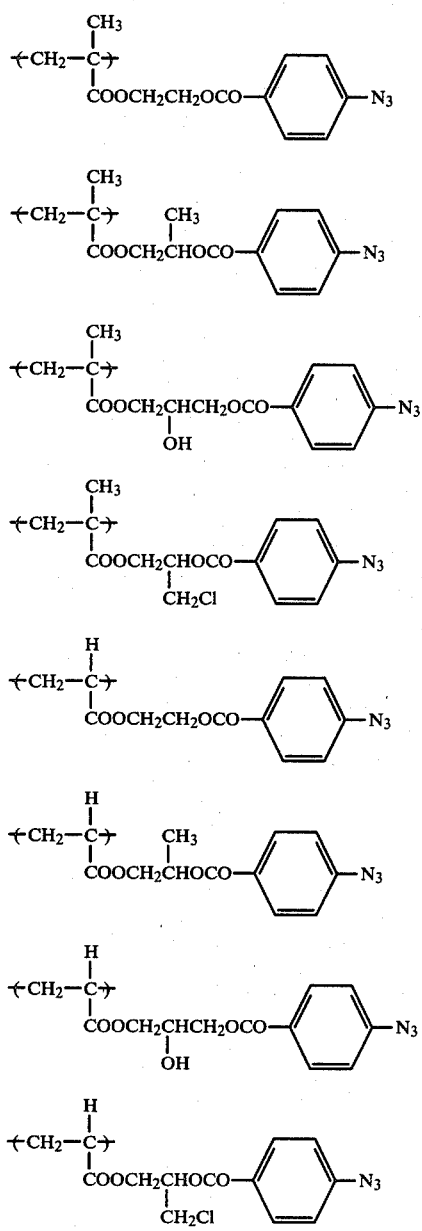

Preferable recurring units (II) are those having the general formula (IIa):

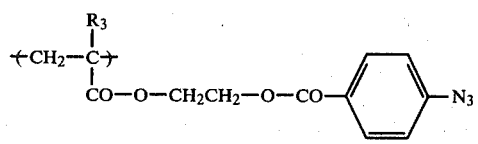

(IIa)

wherein R₃ is as defined above, i.e. recurring units of the following formulas:

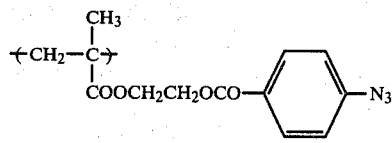

and

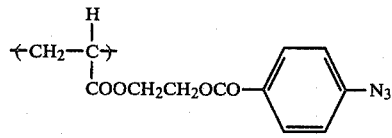

It is preferable that the fluoroalkyl acrylate copolymer of the present invention contains at least 10% by mole, especially at least 20% by mole, of the recurring units (I) and at least 5% by mole, especially at least 10% by mole, of the recurring units (II), based on the total molar number of the monomer units of the copolymer. When the content of the recurring units (I) is less than 10% by mole, the cured copolymer has not a sufficiently low surface energy and is poor in water-repellent and oil-repellent properties. The copolymer containing at least 20% by mole of the recurring units (I) provides a cured copolymer having a very low surface energy, i.e. a critical surface tension of not more that about 25 dynes/cm. On the other hand, when the content of the recurring units (II) is less than 5% by mole, the sensitivity to light and energy rays of the copolymer is insufficient, and the copolymer is hard to be cured and also poor in adhesiveness. The copolymer containing at least 5% by mole of the recurring units (II) has a relative sensitivity to near ultraviolet rays of not less than 0.005 with respect to a homopolymer of 2-methacryloyloxyethyl p-azidobenzoate. Particularly, the copolymer containing at least 10% by mole of the recurring units (II) has a satisfactory sensitivity to light and energy rays.

The copolymer of the present invention may be composed only of the recurring units (I) and (II), or may contain at most 85% by mole, preferably at most 50% by mole, of other vinyl monomer units based on the total molar number of the monomer units of the copolymer.

Examples of the other vinyl monomer used in the present invention are an ethylenically unsaturated olefin such as ethylene, propylene, butylene, isobutylene or butadiene, a styrene compound such as styrene, α-methylstyrene or p-chlorostyrene, an unsaturated carboxylic acid such as acrylic acid, methacrylic acid, itaconic acid, maleic acid or maleic anhydride, an α-methylene aliphatic monocarboxylic acid ester such as methyl acrylate, ethyl acrylate, n-butyl acrylate, isobutyl acrylate, dodecyl acrylate, n-octyl acrylate, 2-chloroethyl acrylate, phenyl acrylate, methyl α-chloroacrylate, methyl methacrylate, ethyl methacrylate, butyl methacrylate or ethyl α-ethylacrylate, a vinyl ether such as vinyl methyl ether, vinyl ethyl ether or vinyl isobutyl ether, a vinyl halide such as vinyl chloride, a vinyl ester such as vinyl acetate, vinyl propionate, vinyl butyrate or vinyl benzoate, an ethylene derivative such as 1-methyl-1'-methoxyethylene, 1,1-dimethoxyethylene, 1,1'-dimethoxyethylene, 1,1'-dimethoxycarbonylethylene or 1-methyl-1'-nitroethylene, a N-vinyl compound such as N-vinylpyrrole, N-vinylcarbazole, N-vinylindole, N-vinylpyridine or N-vinylpyrrolidone, acrylonitrile, methacrylonitrile, acrylamide, methacrylamide, α-ethylacrylamide, acrylic acid anilide, p-chloroacrylic acid anilide, m-nitroacrylic acid anilide, m-methoxyacrylic acid anilide, vinylidene chloride and vinylidene cyanide.

The fluoroalkyl acrylate copolymer of the present invention is prepared by copolymerizing a fluoroalkyl acrylate of the general formula (Ib):

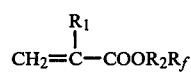
(Ib)

wherein $R_1$, $R_2$ and $R_f$ are as defined above, and an azido compound of the general formula (IIb):

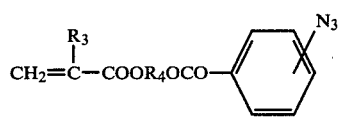
(IIb)

wherein $R_3$ and $R_4$ are as defined above, or copolymerizing the above monomers (Ib) and (IIb) and the before-mentioned other vinyl monomer.

The polymerization is usually carried out by a solution polymerization or emulsion polymerization process, and particularly the solution polymerization is preferable, since the copolymer having more excellent solubility is obtained.

As a solvent in the solution polymerization, there is used a good solvent for the produced copolymer such as tetrahydrofuran, cyclohexanone, ethyleneglycol monoethyl ether acetate, benzene or acetone.

Peroxides and aliphatic azo compounds used in a usual solution polymerization may be used as a polymerization initiator, and particularly azoisobutyronitrile and benzoyl peroxide are preferable. Also, the polymerization temperature is preferably from 45° to 70° C.

The fluoroalkyl acrylate of the general formula (Ib) can be prepared in a known manner, e.g. by reacting a fluoroalcohol with acrylic or methacrylic acid or their derivatives as shown by the following reaction formula:

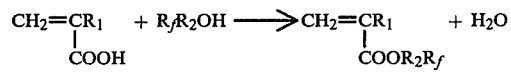

wherein $R_1$, $R_2$ and $R_f$ are as defined above. For instance, 2,2,3,4,4,4-hexafluorobutyl methacrylate is prepared by adding 2,2,3,4,4,4-hexafluorobutyl alcohol and a slight amount of a polymerization inhibitor such as hydroquinone dimethyl ether to methacryloyl chloride and reacting them at a temperature of 60° to 120° C.

The azido compound of the formula (IIb) is prepared in a known manner. For instance, the azido compound is prepared by reacting azidobenzoic acid with thionyl chloride, and then reacting the resulting azidobenzoyl chloride with a hydroxyalkyl acrylate or a hydroxyalkyl methacrylate as shown by the following reaction formula:

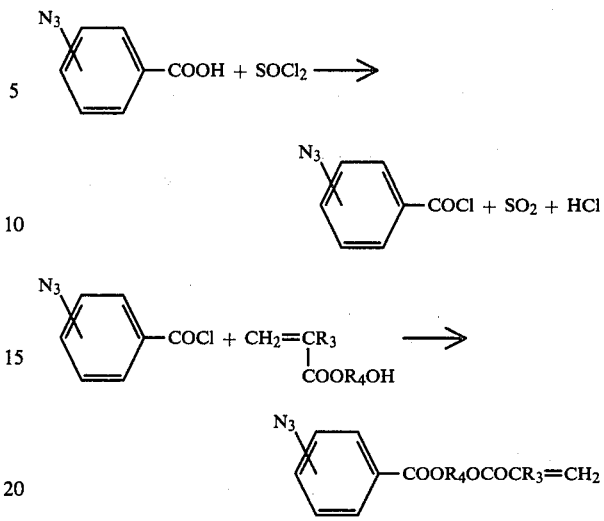

wherein $R_3$ and $R_4$ are as defined above.

The copolymer of the present invention is useful as a light and energy ray sensitive material in verious uses.

The copolymer of the present invention is curable with light and energy rays, and is usable as a plate material of a dry lithographic printing using no water, since the cured polymer film has not only water-repellent property, but also oil-repellent property.

Also, the copolymer of the invention can be cured only by radiation of light or energy rays without heating treatment and, therefore, can be used as a material of a water and oil repellent paint curable at ordinary temperature.

Further, since the cured film of the copolymer of the invention has a good adhesiveness, the copolymer can be used as a resist for producing a negative fine pattern.

Thus, the present invention also provides a light and energy ray sensitive composition containing the fluoroalkyl acrylate copolymer as a light and energy ray sensitive component. Since the copolymer of the present invention is rich in the sensitivity to near ultraviolet rays, far ultraviolet rays, electron beams and X-rays and is curable at ordinary temperature and also has a large molecular weight as mentioned above, the copolymer itself is excellent in film-forming property and does not produce crystal deposition and further has excellent storage stability and adhesiveness. Therefore, it is possible to obtain a desirable light and energy ray sensitive composition by dissolving the copolymer alone in an organic solvent. The concentration of the copolymer is selected from 0.1 to 30% by weight, preferably 0.5 to 15% by weight. Also, in order to further improve coating and developing properties of the composition, other resins may be suitably incorporated in the composition. Other resins are usually employed in the same or less amount than the amount of the copolymer of the invention.

For instance, in case that alkali-developing treatment is intended, it is possible to incorporate an alkali-soluble resin in the composition. Examples of the alkali-soluble resin are a natural resin such as shellac or rosin, a novolak resin such as phenol-formalin-novolak resin or m-cresol-formalin-novolak resin, a homopolymer and copolymer of unsaturated carboxylic acids such as polyacrylic acid, polymethacrylic acid, methacrylic acid-styrene copolymer, methacrylic acid-methyl acrylate copolymer, a maleic anhydride-vinyl compound copolymer, an acrylic acid-vinyl compound copolymer or a methacrylic acid-vinyl compound copolymer, and a partially or completely hydrolyzed polyvinyl acetate acetalized partially with an aldehyde such as acetaldehyde, benzaldehyde, hydroxybenzaldehyde or carbomethoxybenzaldehyde. Also, as occasion demands, the composition of the present invention may be incorporated with an organic solvent-soluble resin, e.g. a cellulose alkyl ether such as cellulose methyl ether or cellulose ethyl ether.

Further, the composition of the present invention may contain a plasticizer compatible with the copolymer of the invention and other additives such as pigment.

The light and energy ray sensitive composition of the present invention can be used in various uses by coating it onto a suitable support, e.g. aluminum plate, zinc plate, copper plate, plastic films, papers, or laminated plates such as bimetal and trimetal and then drying. The coating composition is prepared by dissolving the copolymer of the invention in an organic solvent, if necessary, with other resins. It is desirable that the amount of the total solids in the composition is from 0.1 to 50% by weight based on the organic solvent. The before-mentioned solvents for the copolymer of the invention are used in the preparation of the coating composition.

The composition of the present invention has a good storage stability, and does not change over a long term when stored in the dark. Also, a film obtained by coating the composition onto a support and drying it does not change over several months, when stored in the dark.

A known process is adoptable upon using a plate coated with the copolymer of the present invention. For instance, a relief image of positive type with respect to a negative original can be obtained by bringing the negative original having line or dot images into close contact with the coated plate, exposing to light or energy rays and developing with an organic solvent or an aqueous solution of an alkali. As a light source for the radiation, there can be used a known light source such as a carbon arc lamp, a mercury lamp, a xenon lamp, a chemical lamp, a photoflash lamp, a X-ray radiation appratus or an electron beam radiation apparatus. An organic solvent or an aqueous solution of an alkali is used as a developer. Examples of the organic solvent used as a developer are methanol, ethanol, acetone, benzene, toluene, acetonitrile, methyl cellosolve, ethyl cellosolve, dioxane, tetrahydrofuran, methyl cellosolve acetate, methyl ethyl ketone, cyclohexanone, trichloroethylene, γ-butyrolactone, dimethylformamide, dimethylsulfoxide, ethyl acetate, butyl acetate and mixtures thereof.

The relief image obtained according to the present invention has an excellent chemical resistance and is particularly strong to a corrosive liquid such as nitric acid or a solution of ferric chloride and, therefore, is suitable for use in letterpress printing plate, intaglio printing plate, nameplate or printed wiring or circuit board. Also, since the relief image is excellent in oil-repellent property, mechanical strength and adhesiveness to a support, it is suitable for use in dry lithographic printing plate using no water, and moreover is endurable to production of a large number of prints.

The composition of the present invention is good in film-forming property and does not deposit crystal, and is excellent in storage stability, and also there is a large difference in solubility in an organic solvent between the exposed area and unexposed area to radiation of light, electron beams or X-rays.

Further, since the copolymer of the present invention is easy to adjust its molecular weight and the contents of the recurring units, it is possible to prepare copolymers suitable for various uses as light and energy ray sensitive materials. Moreover, since a relief image obtained by using the composition of the present invention is excellent in printing durability, abrasion resistance, adhesiveness to a support and chemical resistance, it can be put to various uses.

The present invention is more particularly described and explained by means of the following Examples in which all % are by mole unless otherwise noted.

EXAMPLES 1 TO 4

A 200 m. glass ampule was charged with a mixture of tetrahydrofuran of 100 ml., 2,2,3,4,4,4-hexafluorobutyl methacrylate (hereinafter referred to as "HFBM") of an amount shown in Table 1, p-azidobenzoic acid ester of 2-hydroxyethyl methacrylate (hereinafter referred to as "2HEM-ABA") of an amount shown in Table 1, and α,α'-azoisobutyronitrile (hereinafter referred to as "AIBN") of 0.1 g.

The mixture was frozen by liquid nitrogen, and after degassing for 30 minutes by a vacuum pump, was fused at room temperature. These freezing, degassing and fusing procedures were conducted twice, and after freezing the mixture and degassing for 30 minutes, the ampule was sealed.

After fusing the frozen mixture in the ampule at room temperature, the ampule was placed in an oil bath and the polymerization was carried out at 60° C. for 4.5 hours. After the polymerization, the mixture was added to n-hexane with agitation, and the precipitate was filtered with a glass filter and washed with n-hexane and dried under a reduced pressure at room temperature.

The obtained precipitate was subjected to infrared spectrum analysis, gel permeation chromatography and elemental analysis. The infrared spectrum indicated the absorption based on the carbonyl group of HFBM at 1,740 cm.$^{-1}$ and the absorption based on the carbonyl group of p-azidobenzoic acid of 2HEM-ABA at 1,720 cm.$^{-1}$ Also, in the precipitate purified by repeated recrystallization from tetrahydrofuran, there was observed no change in the relative ratio of the intensities of both absorptions. From these results, it was confirmed that the obtained precipitate was a copolymer of HFBM and 2HEM-ABA.

The results of the average molecular weight measurement by gel permeation chromatography are shown in Table 1.

TABLE 1

| Ex. No. | Amount (mole) | | Average molecular weight | |
|---|---|---|---|---|
| | HFBM | 2HEM-ABA | Number average MW | Weight average MW |
| 1. | 0.0072 | 0.0288 | $3.32 \times 10^4$ | $1.34 \times 10^5$ |
| 2. | 0.0144 | 0.0216 | $3.79 \times 10^4$ | $8.78 \times 10^4$ |
| 3 | 0.0252 | 0.0108 | $7.23 \times 10^4$ | $1.86 \times 10^5$ |
| 4 | 0.0306 | 0.0054 | $9.58 \times 10^4$ | $2.15 \times 10^5$ |

The results of the elemental analysis of the obtained copolymers and the HFBM content calcutated therefrom are shown in Table 2.

TABLE 2

| Ex. No. | Elemental analysis(% by weight) | | | | HFBM content (%) |
|---|---|---|---|---|---|
| | H | C | N | F | |
| 1 | 4.1 | 51.26 | 10.08 | 13.7 | 33.0 |
| 2 | 3.9 | 48.80 | 8.30 | 18.9 | 45.6 |
| 3 | 3.4 | 43.75 | 4.28 | 31.9 | 73.1 |
| 4 | 3.1 | 42.03 | 2.32 | 39.5 | 86.6 |

Taking nitrogen liberated during the elemental analysis and the operation reaching the analysis into consideration, it is considered that the produced copolymer has nearly the same composition as the proportion of the charged monomers, HFBM and 2HEM-ABA.

EXAMPLES 5 TO 7

The procedures of Example 1 were repeated except that 2,2,3,3,4,4,5,5-octafluoropentyl acrylate (hereinafter referred to as "OFPA") was employed instead of HFBM to give dried precipitates.

The infrared spectrum measurement and gel permeation chromatography of the obtained precipitate were carried out.

The infrared spectrum indicated the absorption based on the carbonyl group of OFPA at 1,760 cm.$^{-1}$ and the absorption based on the carbonyl group of p-azidobenzoic acid of 2HEM-ABA at 1,720 cm.$^{-1}$ Also, in the precipitate purified by repeated recrystallization from tetrahydrofuran, there was observed no change in the relative ratio of the intensities of both absorptions. From these results, it was confirmed that the obtained precipitate was a copolymer of OFPA and 2HEM-ABA.

The results of the average molecular weight measurement by gel permeation chromatography are shown in Table 3.

TABLE 3

| Ex. No. | Amount (mole) | | Average molecular weight | |
|---|---|---|---|---|
| | OFPA | 2HEM-ABA | Number average MW | Weight average MW |
| 5 | 0.0072 | 0.0288 | $1.05 \times 10^4$ | $1.90 \times 10^4$ |
| 6 | 0.0144 | 0.0216 | $2.73 \times 10^3$ | $5.72 \times 10^3$ |
| 7 | 0.0252 | 0.0108 | $1.58 \times 10^4$ | $4.83 \times 10^4$ |

COMPARATIVE EXAMPLES 1 TO 3

A 200 ml. glass ampule was charged with a mixture of 100 ml. of tetrahydrofuran, 0.036 mole of a monomer shown in Table 4, 0.1 g. of AIBN, and the polymerization was carried out in the same manner as in Example 1 to give a homopolymer.

There are shown in Table 4 the results of the average molecular weight measurement of the produced homopolymers by gel permeation chromatography.

TABLE 4

| | Monomer | Average molecular weight | |
|---|---|---|---|
| | | Number average MW | Weight average MW |
| Com. Ex. 1 | 2HEM-ABA | $3 \times 10^3$ | $1.3 \times 10^4$ |
| Com. Ex. 2 | HFBM | $1.87 \times 10^5$ | $2.74 \times 10^5$ |
| Com. Ex. 3 | OFPA | $7.16 \times 10^4$ | $2.08 \times 10^5$ |

EXAMPLES 8 TO 14

Each of the copolymers obtained in Examples 1 to 7 and the 2HEM-ABA homopolymer obtained in comparative Example 1 was employed as a sensitive component, and was dissolved in dioxane to give a 10% by weight solution. Each solution was applied to a grained aluminum plate by employing a spin coater (number of rotations: 150 to 160 r.p.m.), and was air-dried to give a sensitive material.

A negative original (commercial name "Step Tablet No. 2" made by Eastman Kodak Co.) was superposed on the coated surface of the sensitive material and was brought into close contact therewith by covering with a glass plate. A high pressure mercury lamp (450 W) was employed as a light source, and the coating was exposed to the light for 4 minutes at a distance of 30 cm. through the negative original. After the exposure, vat development with dioxane was carried out for 1 minute to give a relief image of positive type.

The relative sensitivity of the copolymer of the invention to the sensitivity of the 2HEM-ABA homopolymer was obtained by measuring the number of the remaining steps in the obtained relief image.

The results are shown in Table 5.

TABLE 5

| Ex. No. | Copolymer | Relative sensitivity |
|---|---|---|
| 8 | Example 1 | 0.48 |
| 9 | Example 2 | 0.37 |
| 10 | Example 3 | 0.02 |
| 11 | Example 4 | 0.01 |
| 12 | Example 5 | 0.37 |
| 13 | Example 6 | 0.09 |
| 14 | Example 7 | 0.03 |

EXAMPLE 15

By employing the polymers obtained in Examples 1 to 3 and 5 to 7 and Comparative Examples 2 and 3, light and energy ray sensitive materials were prepared in the same manner as in Example 8. The whole surface of the coating of each sensitive material was exposed to cure to the light in the same manner as in Example 8 without using the negative original.

With respect to the thus obtained cured coatings, the contact angle to an organic solvent was measured at 20° C. by employing a goniometer. The organic solvents used in the measurement were pentane, octane, decane, tridecane and hexadecane.

From the values of the contact angle, the critical surface tension was obtained according to the Zisman plotting method in which the contact angles $\theta$ of various structurally similar liquid compounds having different surface tensions $\gamma_{LV}$ to the same solid material are measured, the values of $\cos \theta$ are plotted with respect to the surface tension $\gamma_{LV}$, the plotted points are extrapolated with line to the point of $\cos \theta = 1$ and the value of $\gamma_{LV}$ at that point is regarded as the critical surface tension. The surface tensions of pentane, octane, decane, tridecane and hexadecane were 20.3, 21.8, 23.9, 25.9 and 27.5 dynes/cm., respectively.

The results of the contact angle and the critical surface tension are shown in Table 6.

TABLE 6

| Polymer | Contact angle (degree) | | | | | Critical surface tension (dyne/cm.) |
| --- | --- | --- | --- | --- | --- | --- |
| | Heptane | Octane | Decane | Tridecane | Hexadecane | |
| Example 1 | — | — | 14.2 | 20.1 | 27.3 | 22.7 |
| Example 2 | — | 13.7 | 21.5 | 29.3 | 35.2 | 21.0 |
| Example 3 | 18.0 | — | 34.6 | 40.3 | 44.5 | 18.7 |
| Comparative Example 2 | 26.9 | 34.8 | 41.4 | 50.3 | 54.8 | 17.9 |
| Example 5 | — | — | 17.5 | 25.4 | 31.0 | 22.2 |
| Example 6 | 9.7 | 17.9 | 30.4 | 35.6 | 40.0 | 19.9 |
| Example 7 | 19.0 | 26.0 | 35.3 | 41.3 | 46.2 | 18.8 |
| Comparative Example 3 | 23.8 | 31.7 | 41.1 | — | — | 18.5 |

EXAMPLE 16 AND COMPARATIVE EXAMPLE 4

The polymers obtained in Example 2 and Comparative Example 1 were employed as a sensitive component, and were dissolved in tetrahydrofuran to give 10% by weight solutions. Each solution was coated on a glass plate by a spin coater and was dried to give a coating having a thickness of about 1 μm.

The obtained coatings were irradiated with X-rays in varied amounts of irradiation, and developed with dioxane. By the weight measurement of the coating before irradiation ($W_o$) and the coating after development (W), there was obtained the remaining film ratio (W/Wo), i.e. gel fraction. The X-ray irradiation was carried out in vacuo (1 mmHg) by employing $L_\alpha$ ray (wavelength: 4.6 angstroms) of rhodium radiated when electron beam (0.7 kW, 20 keV) was radiated to rhodium target. The dose rate of X-rays at a place distant from the target by 12 cm. was 5.7 mJ/cm.$^2$/minute.

The relationship between the dose and the gel fraction is shown in FIG. 1.

From FIG. 1, it would be understood that the copolymer of the present invention obtained in Example 2 is sufficiently usable as a X-ray resist.

The sensitivity of the X-ray resist obtained from FIG. 1 by half width method is shown in Table 7.

TABLE 7

| | X-ray resist sensitivity (mJ/cm$^2$.) |
| --- | --- |
| Example 16 | 250 |
| Com. Ex. 4 | 500 |

EXAMPLE 17

A 10% by weight solution of the copolymer of 70% of OFPA and 30% of 2HEM-ABA was prepared by dissolving the copolymer in tetrahydrofuran, and was coated by a spin coater onto a chromium layer plated on a glass plate and pre-baked at 80° C. for 8 minutes to give a coating having an initial film thickness of 0.50 μm.

By employing a far ultraviolet ray radiation apparatus equipped with a 500 W Xe-Hg lamp (Tamarack Deep UV Printer 155DUV), the coatings were exposed to the light for varied periods of irradiation. The exposure rate dose was 0.6 mW/cm.$^2$/min. in the measured wavelength 2,537 angstroms.

After the irradiation, the coatings were developed by immersing in dioxane for 2 minutes at a temperature of 20° to 21° C. and rinsing with isopropyl alcohol for 1 minute, and were dried. The thickness of the coatings was then measured by employing a Talystep (Rank Tailorhobson, England) (50,000 magnifications), and the normalized film thickness was calculated based on the thickness change.

Figure 2:
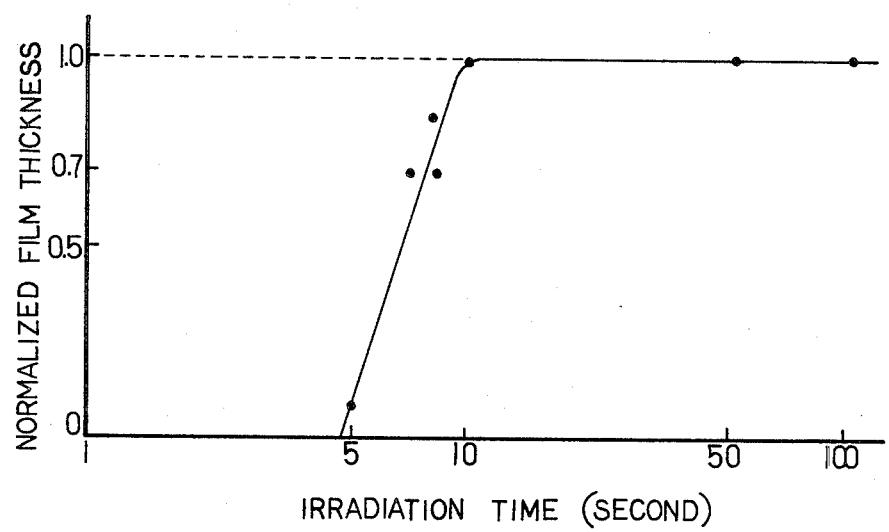
FIG. 2 is a graph showing the relationship between irradiation time and normalized film thickness in irradiation of far ultraviolet rays to a copolymer of the present invention.

The relationship between the normalized film thickness and the irradiation time is shown in FIG. 2. At the normalized film thickness 0.7, the irradiation time and sensitivity were 7.8 seconds and 4.7 mJ/cm.$^2$ respectively, and γ value showing resolution was 3.

Also, a coating was prepared in the same manner as above and was employed as a resist. The coating was exposed to light through a negative original having a line pattern (width of line: 1 μm., pitch: 2.5 mμ) and was developed. The pattern was sufficiently resolved. Further, the patterned coating was post-baked at 160° C. for 30 minutes. The resolution was sufficient, and the deformation and separation were not observed and the adhesiveness was good.

EXAMPLE 18

Several coated plates were prepared in the same manner as in Example 17. The coatings were exposed to electron beam (acceleration voltage: 10 keV, beam diameter: 0.25 μm.) in varied amounts of electric charge.

The coatings were then developed by immersing in dioxane for 90 seconds at a temperature of 20° to 21° C. and rinsing with isopropyl alcohol for 90 seconds. After drying the coatings, the thickness was measured by employing the Talystep (50,000 magnifications), and the normalized film thickness was calculated based on the thickness change.

Figure 3:
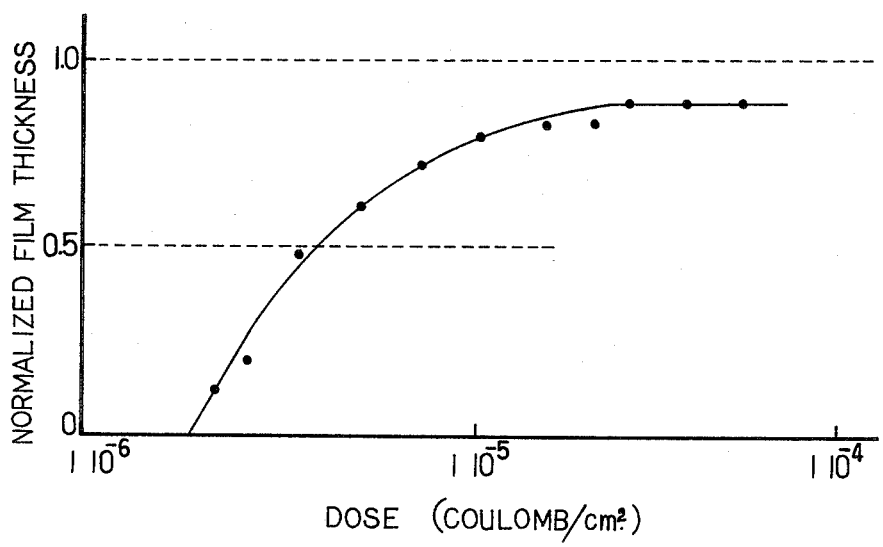
FIG. 3 is a graph showing the relationship between dose and normalized film thickness in irradiation of electron beams to a copolymer of the present invention.

The relationship between the normalized film thickness and the dose of electron is shown in FIG. 3.

At the normalized film thickness 0.5, the sensitivity and the γ value were $4.3 \times 10^{-6}$ coulombs/cm.$^2$ and 1, respectively.

Also, the coating was employed as a resist, and 10 lines (width of line: 1 μm., space: 1 μm.) were imaged on the coating by electron beam (acceleration voltage: 10 keV, beam diameter: 0.5 μm., dose of electron: $5.5 \times 10^{-6}$ coulombs/cm.$^2$). The coating was then developed by immersing in dioxane at 20° C. for 90 seconds and rinsing with isopropyl alcohol at 20° C. for 90 seconds. The unirradiated portion was dissolved and the irradiated portion left as a sharp line image.

What we claim is:

1. A fluoroalkyl acrylate copolymer comprising at least 10% by mole of recurring units of the general formula (I):

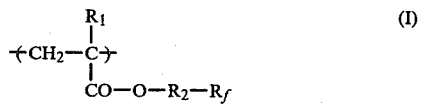

wherein $R_1$ is hydrogen atom or methyl group, $R_2$ is a bivalent hydrocarbon group having 1 to 5 carbon atoms, and $R_f$ is a $C_2$ to $C_6$ straight or branched perfluoroalkyl group or a $C_2$ to $C_6$ straight or branched fluoroalkyl group having hydrogen atoms of not less than one and of not more than half of the number of the carbon atoms, and at least 5% by mole of recurring units of the general formula (II):

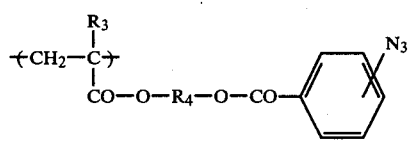
(II)

wherein R₃ is hydrogen atom or methyl group, and R₄ is a bivalent hydrocarbon group or a mono-substituted bivalent hydrocarbon group with hydroxyl group or a halogen except fluorine having 1 to 5 carbon atoms.

2. The copolymer of claim 1, wherein the content of the recurring units (I) is at least 20% by mole and the content of the recurring units (II) is at least 10% by mole.

3. The copolymer of claim 1, wherein the recurring unit (I) is a unit of the general formula (Ia):

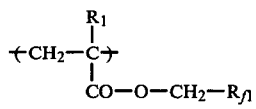
(Ia)

wherein $R_1$ is as defined above and $R_{f1}$ is —CF₂CFHCF₃ or —(CF₂)₄H,
and the recurring unit (II) is a unit of the general formula (IIa):

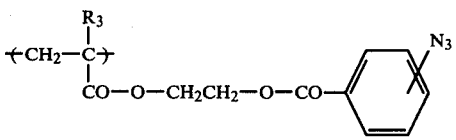
(IIa)

wherein R₃ is as defined above.

* * * * *